(12) United States Patent
Fan

(10) Patent No.: US 8,931,860 B2
(45) Date of Patent: Jan. 13, 2015

(54) MOUNTING APPARATUS FOR SLIDING DRAWER MECHANISM

(75) Inventor: Chen-Lu Fan, New Taipei (TW)

(73) Assignee: ScienBiziP Consulting(Shenzhen)Co., Ltd., Guangdong (CN)

( * ) Notice: Subject to any disclaimer, the term of this patent is extended or adjusted under 35 U.S.C. 154(b) by 167 days.

(21) Appl. No.: 13/401,406

(22) Filed: Feb. 21, 2012

(65) Prior Publication Data

US 2012/0312943 A1   Dec. 13, 2012

(30) Foreign Application Priority Data

Jun. 8, 2011 (TW) .............................. 100120058 A

(51) Int. Cl.
*A47B 95/00* (2006.01)
*H05K 7/14* (2006.01)

(52) U.S. Cl.
CPC .................................... *H05K 7/1489* (2013.01)
USPC .................. 312/333; 312/330.1; 312/334.44; 248/222.12

(58) Field of Classification Search
CPC ...... H05K 7/1489; A47B 88/04; A47B 88/00; A47B 88/10; A47B 2088/0403; A47B 2210/0059
USPC ............. 312/333, 334.1, 334.4, 334.7, 319.1, 312/334.44, 334.45, 334.46, 334.47; 211/26, 192, 126.15, 183; 248/220.41, 248/220.21, 220.22, 221.11, 222.14, 244, 248/222.11, 222.12

See application file for complete search history.

(56) References Cited

U.S. PATENT DOCUMENTS

| | | | |
|---|---|---|---|
| 7,281,694 B2 * | 10/2007 | Allen et al. .................... | 248/244 |
| 7,703,734 B2 * | 4/2010 | Chen et al. ................... | 248/298.1 |
| 7,798,582 B2 * | 9/2010 | Yu et al. ...................... | 312/334.4 |
| 7,988,246 B2 * | 8/2011 | Yu et al. ...................... | 312/334.4 |
| 8,079,654 B2 * | 12/2011 | Yu et al. ...................... | 312/334.4 |
| 8,328,300 B2 * | 12/2012 | Yu et al. ........................ | 312/333 |
| 2011/0233355 A1 * | 9/2011 | Peng et al. .................. | 248/218.4 |
| 2011/0240580 A1 * | 10/2011 | Yu et al. ........................ | 211/183 |
| 2013/0016930 A1 * | 1/2013 | Fan et al. ........................ | 384/35 |
| 2013/0026113 A1 * | 1/2013 | Fan et al. ......................... | 211/26 |

* cited by examiner

*Primary Examiner* — Todd M Epps
(74) *Attorney, Agent, or Firm* — Novak Druce Connolly Bove + Quigg LLP

(57) ABSTRACT

A mounting apparatus for a sliding drawer mechanism is disclosed. The mounting apparatus includes a bracket, a latching member and a mounting piece. The bracket includes a side plate, and the side plate defines a limiting hole. The latching member is secured to the sliding drawer mechanism and includes an elastic latching portion. The mounting piece extends from the sliding drawer mechanism, and a mounting post protrudes from the mounting piece. The mounting post is received in the limiting hole to prevent the sliding drawer mechanism from sliding along a direction substantially parallel to the side plate, and the elastic latching portion and the mounting piece are located on two opposite sides of the side plate, to prevent the sliding drawer mechanism from sliding along a direction substantially perpendicular to the side plate.

16 Claims, 6 Drawing Sheets

MOUNTING APPARATUS FOR SLIDING DRAWER MECHANISM

BACKGROUND

1. Technical Field

The present disclosure relates to mounting apparatuses, and particularly to a mounting apparatus for a sliding drawer mechanism, which is secured to an electronic device.

2. Description of Related Art

A sliding drawer mechanism is used to a drawer with a cupboard and a server with a rack, movable relative to each other. Generally, a sliding drawer mechanism drawer mechanism includes an inner sliding member, a middle sliding member, and an outer sliding member. The outer sliding member is secured to a bracket of the rack, the inner sliding member is secured to a side surface of the server, and the middle sliding member is connected between the inner sliding member and the outer sliding member. The middle sliding member adds to the range of movement of the server. The middle sliding member and the inner sliding member are slidable relative to the outer sliding portion, and the server is slidable relative to the rack by the sliding drawer mechanism. However, the outer sliding member is always secured to the bracket by a plurality of screws, which is every inconvenient.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
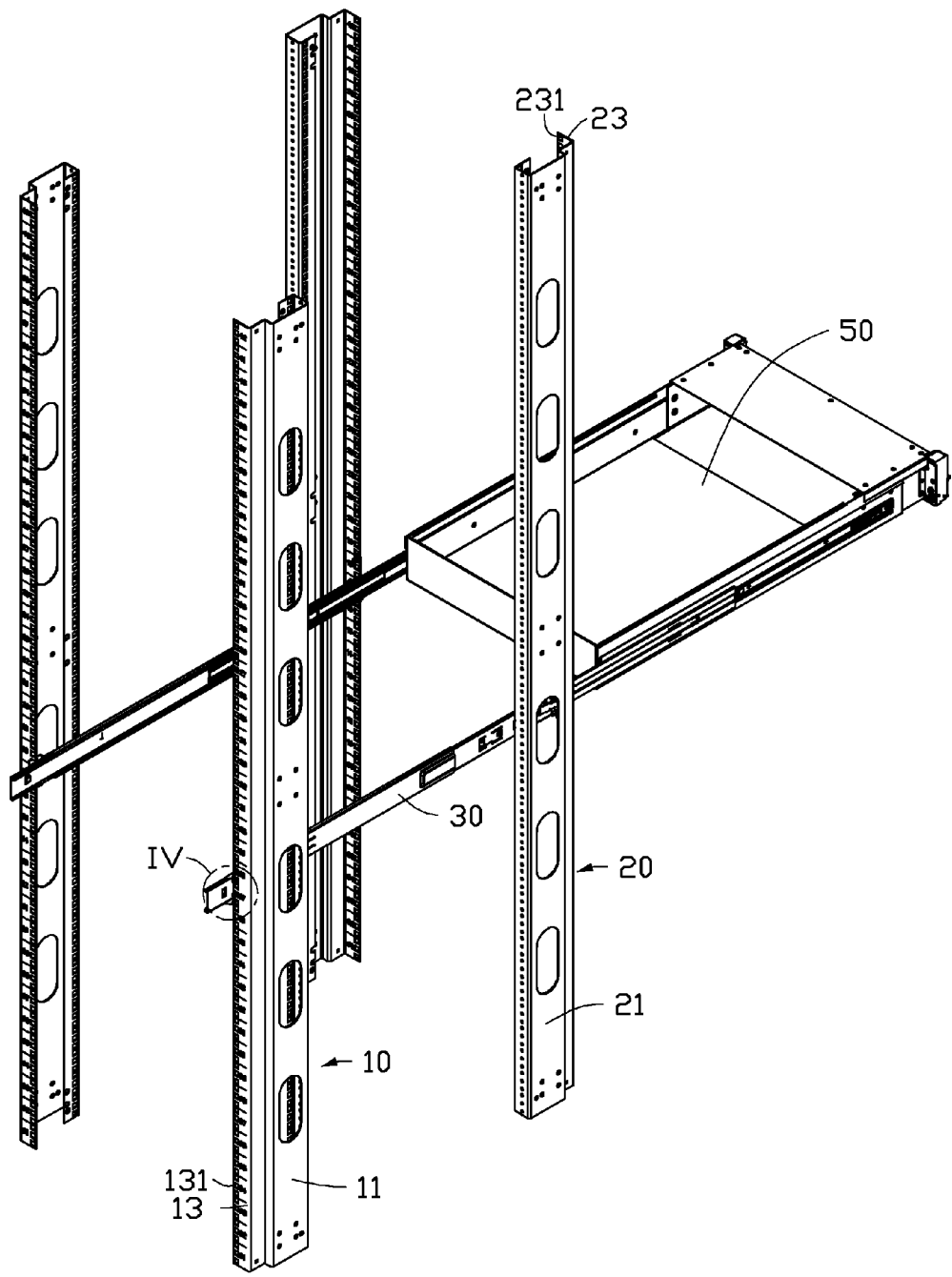
FIG. 1 is an exploded, isometric view of an embodiment of a mounting apparatus, a sliding drawer mechanism and a server.
Figure 2:
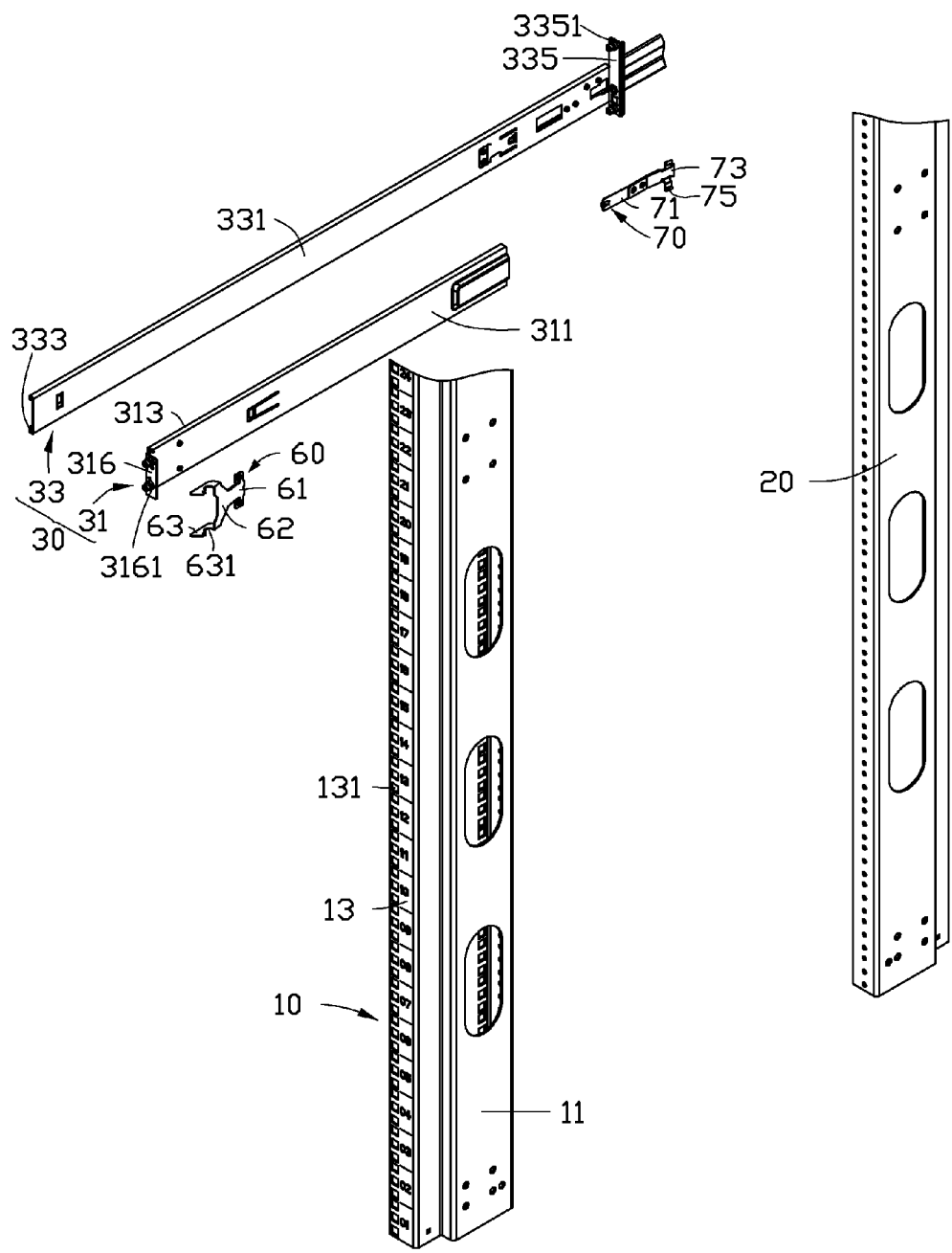
FIG. 2 is a partly exploded view of the mounting apparatus and the sliding drawer mechanism of FIG. 1.

Referring to FIG. 1 and FIG. 2, a mounting apparatus in accordance with an embodiment is configured for securing a sliding drawer mechanism 30. The mounting apparatus includes a first bracket 10 and a second bracket 20. In one embodiment, the sliding drawer mechanism 30 is adapted to secure a server 50 to the first bracket 10 and the second bracket 20.

The first bracket 10 includes a first rear plate 11 and a first side plate 13 connected to the first rear plate 11. The first side plate 13 defines a plurality of first limiting holes 131. The second bracket 20 includes a second rear plate 21 and a second side plate 23 connected to the second rear plate 21. The second side plate 23 defines a plurality of second limiting holes 231. The first bracket 10 and the second bracket 20 are secured to the server rack. The first rear plate 11 and the second rear plate 21 are located in a same panel. The first side plate 13 is substantially parallel to the second side plate 23.

Figure 3:
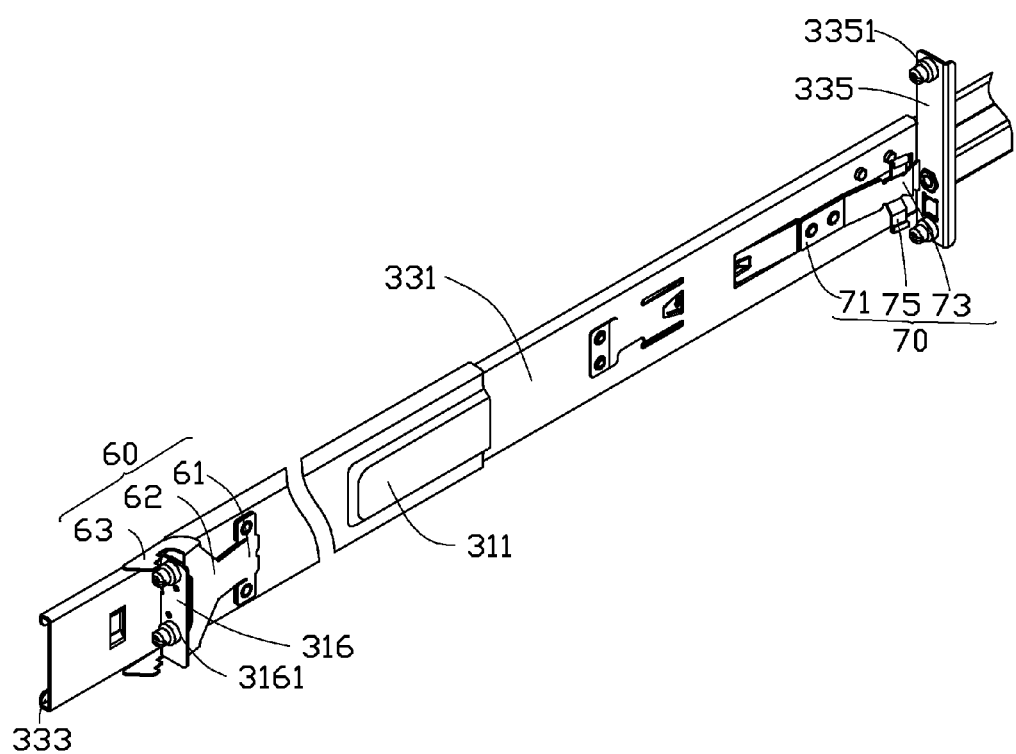
FIG. 3 is a cutaway, partly assembled view of the mounting apparatus and the sliding drawer mechanism of FIG. 2.

Referring to FIG. 2 and FIG. 3, the sliding drawer mechanism 30 includes an installing sliding member 31 and an outer sliding member 33 slidably mounted to the installing sliding member 31. The installing sliding member 31 includes an installing plate 311 and an installing portion 313 extends from each of a top edge and a bottom edge of the installing plate 311. A sliding slot (not labeled) is defined by the installing plate 311 and the installing portion 313. A flange 316 extends from a side edge of the installing plate 311. Two limiting posts 3161 protrude from the flange 316. The two limiting posts 3161 can be engaged in the first limiting holes 131. The outer sliding member 33 is longer than the installing sliding member 31.

The outer sliding member 33 includes a body 331 and a sliding portion 333 extends from each of a top edge and a bottom edge of the body 331. In one embodiment, the sliding portion 333 is substantially "L" shaped. A mounting piece 335 extends from a side edge of the body 331. Two mounting posts 3351 protrude from the mounting piece 335. The two mounting posts 3351 can be received in the second limiting holes 231.

A latching assembly is adapted to secure the sliding drawer mechanism 30 to the first bracket 10 and the second bracket 20. In one embodiment, the latching assembly is a first latching member 60. The first latching member 60 includes an installing piece 61 and a connecting piece 62 connected to the installing piece 61. A first elastic latching portion 63 extends from each of two side edges of the connecting piece 62. The first latching portion 63 defines a latching slot 631. The first side plate 13 can be engaged in the latching slot 631. In one embodiment, the first latching portion 63 is substantially perpendicular to the connecting piece 62, and the latching slot 631 is curved. The first latching member 60 can be secured to the installing sliding member 31 or the outer sliding member 33 (shown in FIG. 3 is the first latching member 60 secured to the installing sliding member 31). The installing piece 61 is secured to the installing plate 311 by soldering, riveting or other securing methods. The first latching portion 63 extends out of the flange 316. The first latching portion 63 is substantially perpendicular to the installing plate 311.

In another embodiment, the latching assembly is a second latching member 70. The second latching member 70 includes a mounting portion 71 and a second latching portion 73 extending obliquely from the mounting portion 71. An operating portion 75 obliquely extends from each of a top edge and a bottom edge of the second latching portion 73. The second latching member 70 can be secured to the installing sliding member 31 or the outer sliding member 33 (shown in FIG. 3 is the second latching member 70 secured to the outer sliding member 33). The mounting portion 71 is secured to the body 331 by soldering, riveting or other securing methods. The mounting piece 335 is adjacent to a free end of the second latching portion 73. An acute angle is defined between the second latching portion 73 and the body 331.

In assembly of the sliding drawer mechanism 30, outer sliding member 33 is moved towards the installing sliding member 31, and the sliding portion 333 abuts the installing portion 313. The outer sliding member 33 is partly received in the sliding slot of the installing sliding member 31 and is slidable relative to the installing sliding member 31.

Figure 4:
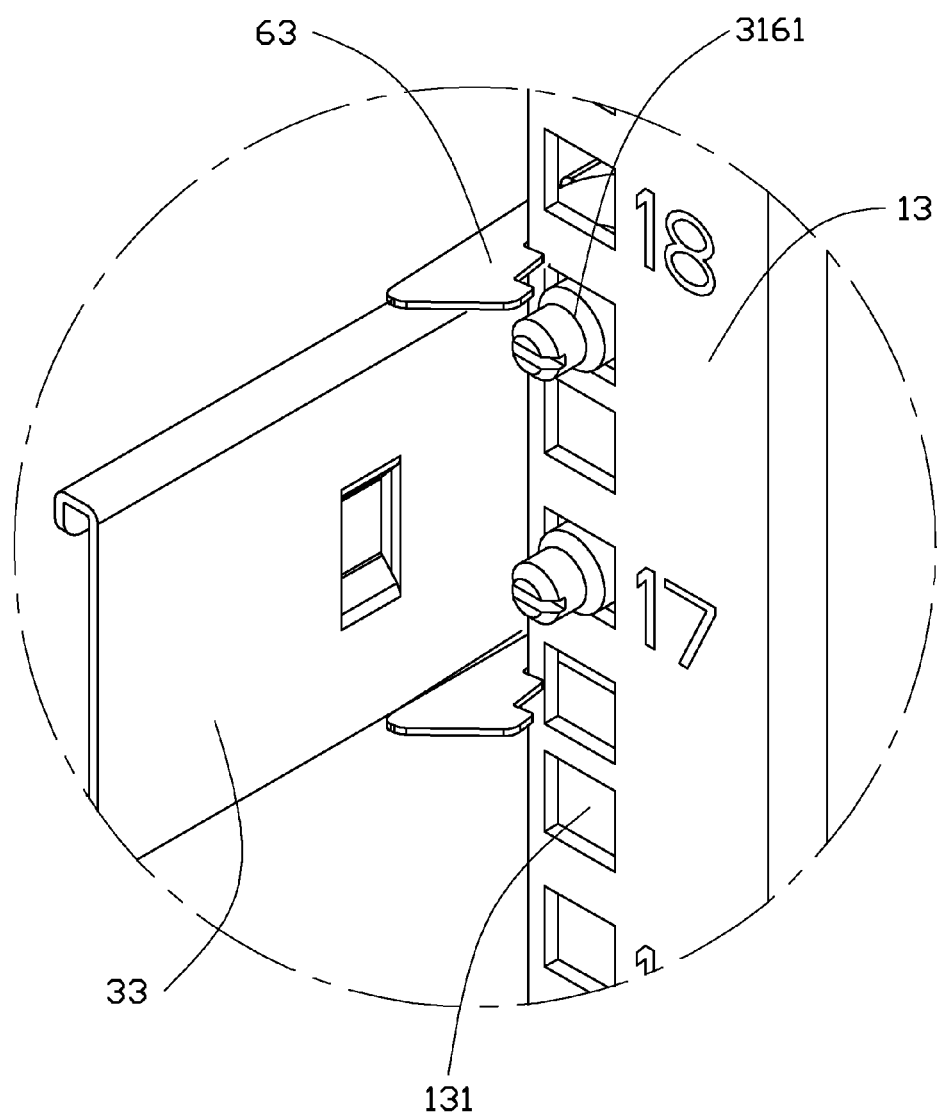
FIG. 4 is an enlarged view of a circled portion IV of FIG. 1.
Figure 5:
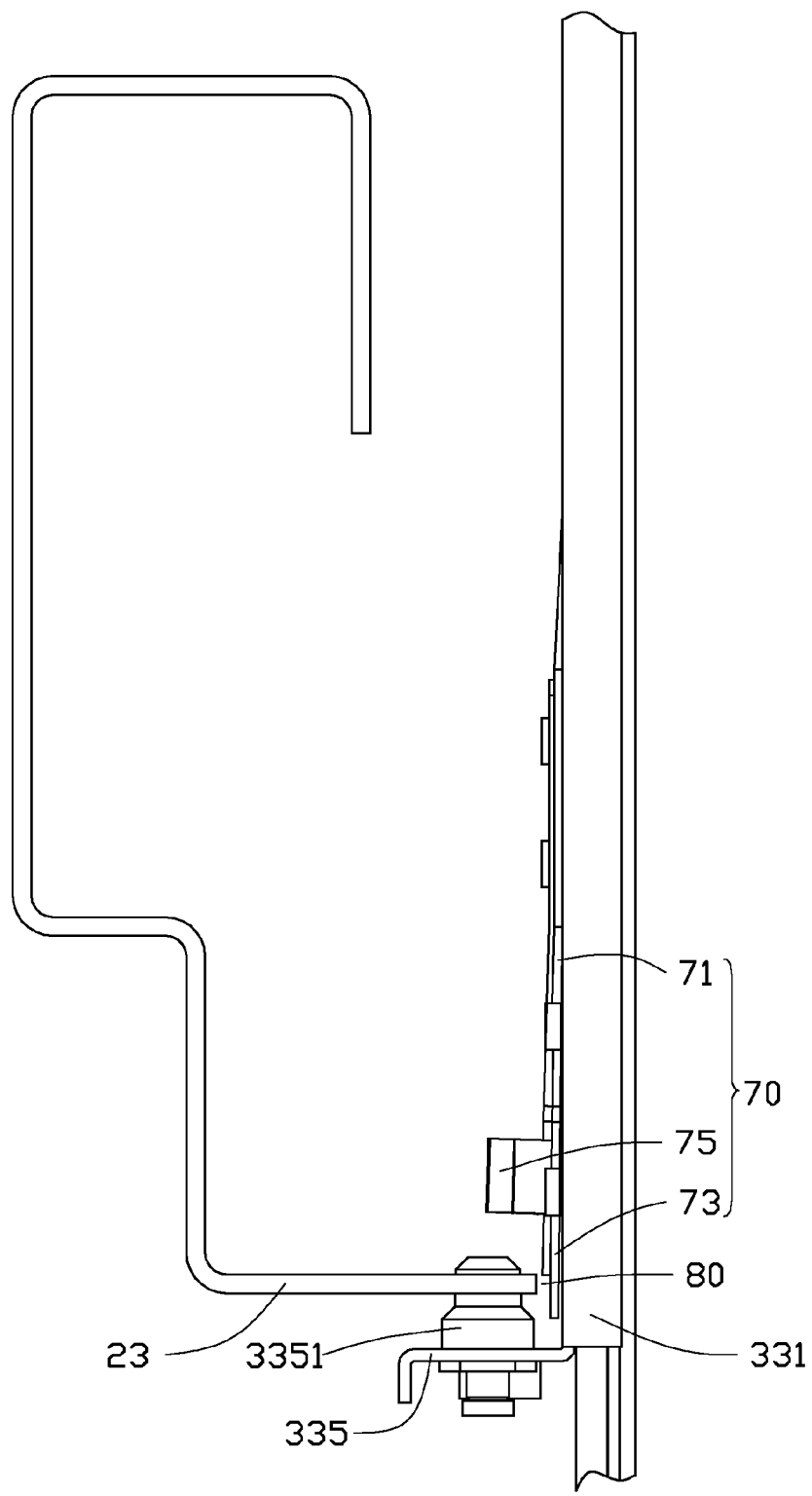
FIG. 5 is similar to FIG. 1, but viewed in a different aspect.
Figure 6:
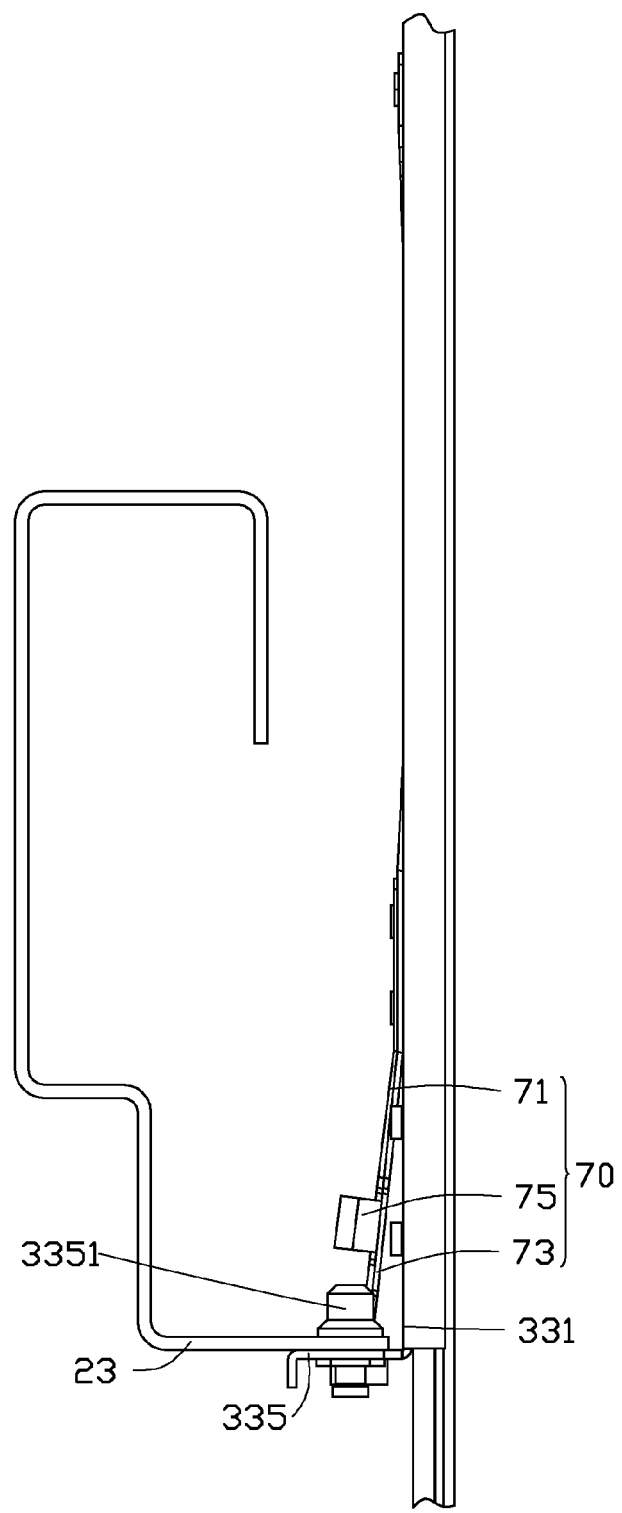
FIG. 6 is similar to FIG. 5, but the mounting apparatus and the sliding drawer mechanism is in another position.

Referring to FIGS. 4-6, in assembly the sliding drawer mechanism 30 to the first bracket 10 and the second bracket 20, the installing sliding member 31 is moved to the first bracket 10, the flange 316 is adjacent to the first side plate 13 and located between the first side plate 13 and the second side plate 23, and each of the two limiting posts 3161 is aligned with each of the two first limiting holes 131. The mounting piece 335 is adjacent to the second side plate 23 and located outside of the second side plate 23. A gap 80 is defined between the body 331 and the second side plate 23. The second latching portion 73 is pressed by the second side plate 23 and elastically deformed towards the body 331, and then the second latching portion 73 is received in the gap 80. The first latching member 60 is moved towards the first side plate 13, and the two first latching portions 63 are pressed by the first side plate 13. The two first latching portions 63 are elastically deformed away from each other until the flange 316 abuts the first side plate 13. The first latching portion 63 rebounds to engage the first side plate 13 to the latching slot 631. Each of the two limiting posts 3161 is engaged in each of the two first limiting holes 131, to prevent the installing sliding member 31 from moving along a direction substantially parallel to the first side plate 13. The first latching portion 63 is engaged with the first side plate 13 and prevents the installing sliding member 31 from moving along a direction substantially perpendicular to the first side plate 13. The flange 316 is substantially perpendicular to the first side plate 13. An extending direction of the first latching portion 63 is substantially parallel to the flange 316.

The outer sliding member 33 is slid towards the first bracket 10 relative to the installing sliding member 31, until the mounting piece 335 abuts the second side plate 23. Each of the two mounting posts 3351 is received in each of the two second limiting holes 231, to prevent the outer sliding member 33 from moving a direction substantially parallel to the second side plate 23. The second latching portion 73 is disengaged from the gap 80 and rebounds to abut the second side plate 23, and then the outer sliding member 33 is blocked from moving along a direction substantially perpendicular to the second side plate 23. Thus, the sliding drawer mechanism 30 is secured to the first bracket 10 and the second bracket 20. An extending direction of the second latching portion 73 is substantially parallel to the mounting piece 335. The mounting piece 335 is substantially parallel to the second side plate 23.

In disassembly, the second latching portion 73 is driven to elastically deform towards the body 331, and the outer sliding member 33 is slid away from the first side plate 13. The second latching portion 73 is slid into the gap 80. The two mounting posts 3351 are disengaged from the two second limiting holes 231. The two first latching portions 63 are driven to elastically deform away from each other, causing the two first latching portions 63 are disengaged from the first side plate 13. The installing sliding member 31 is moved towards the second side plate 23, causing the two limiting posts 3161 to disengage from the two first limiting holes 131. Thus, the sliding drawer mechanism 30 is disassembled from the first bracket 10 and the second bracket 20.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for a sliding drawer mechanism comprising:
    a bracket comprising a side plate, and the side plate defining a limiting hole;
    a latching member secured to the sliding drawer mechanism and comprising a mounting portion secured to the sliding drawer mechanism, an elastic latching portion obliquely extending from the mounting portion, and an operation portion extending outwards from each of a top edge and a bottom edge of the elastic latching portion in two opposite directions; and the two operation portions are operable to elastically deform the elastic latching portion; and
    a mounting piece extending from the sliding drawer mechanism, and a mounting post located on the mounting piece;
    wherein the mounting post is received in the limiting hole to prevent the sliding drawer mechanism from sliding along a first direction substantially parallel to the side plate, and the elastic latching portion and the mounting piece are located on two opposite sides of the side plate, to prevent the sliding drawer mechanism from sliding along a second direction substantially perpendicular to the side plate.

2. The mounting apparatus of claim 1, wherein the mounting piece is substantially parallel to the side plate.

3. The mounting apparatus of claim 1, wherein the side plate is substantially perpendicular to the sliding drawer mechanism, a gap is defined between an edge of the side plate and the sliding drawer mechanism, and the gap receives the elastic latching portion when the elastic latching portion is elastically deformed, allowing the sliding drawer mechanism to slide relative to the side plate; and the elastic latching portion rebounds to disengage from the gap and locate on a side of the two opposite sides of the side plate, preventing the sliding drawer mechanism to slide relative to the side plate.

4. The mounting apparatus of claim 1, wherein an angle is defined between the elastic latching portion and the sliding drawer mechanism, and the angle is acute.

5. The mounting apparatus of claim 1, wherein an extending direction of the operating portion is substantially parallel to the mounting piece.

6. The mounting apparatus of claim 1, wherein an extending direction of the elastic latching portion is substantially perpendicular to the mounting piece.

7. The mounting apparatus of claim 1, wherein the elastic latching portion extends from each of two opposite edges of the mounting portion, and the mounting post is located between the elastic latching portions of the two opposite edges.

8. The mounting apparatus of claim 1, wherein the elastic latching portion defines a latching slot, and the side plate is engaged in the latching slot.

9. A mounting apparatus for a sliding drawer mechanism comprising:
    a bracket comprising a side plate, and the side plate defining a limiting hole;
    a latching member secured to the sliding drawer mechanism and comprising a mounting portion secured to the sliding drawer mechanism, an elastic latching portion obliquely extending from the mounting portion, and an operation portion extending outwards from each of a top edge and a bottom edge of the elastic latching portion in two opposite directions; and the two operation portions are operable to elastically deform the elastic latching portion; and a mounting piece extending from the sliding drawer mechanism, and a mounting post protruding from the mounting piece;

wherein the sliding drawer mechanism is slidable relative to the side plate; the mounting piece is substantially perpendicular to the sliding drawer mechanism, a gap is defined between an edge of the side plate and the sliding drawer mechanism, and the elastic latching portion is received in the gap when the elastic latching portion is elastically deformed; the mounting post is received in the limiting hole to prevent the sliding drawer mechanism from sliding along a first direction substantially parallel to the side plate, and the elastic latching portion and the mounting piece are located on two opposite sides of the side plate, to prevent the sliding drawer mechanism from sliding along a second direction substantially perpendicular to the side plate.

10. The mounting apparatus of claim 9, wherein the mounting piece is substantially parallel to the side plate, and the side plate is substantially perpendicular to the sliding drawer mechanism.

11. The mounting apparatus of claim 10, wherein when the elastic latching portion is received in the gap, the mounting post is disengaged from the limiting hole, allowing the sliding drawer mechanism to slide relative to the side plate; and the elastic latching portion rebounds to disengage from the gap and locate on a side of the two opposite sides of the side plate, preventing the sliding drawer mechanism to slide relative to the side plate.

12. The mounting apparatus of claim 9, wherein an angle is defined between the elastic latching portion and the sliding drawer mechanism, and the angle is acute.

13. The mounting apparatus of claim 9, wherein an extending direction of the operating portion is substantially parallel to the mounting piece.

14. The mounting apparatus of claim 9, wherein an extending direction of the elastic latching portion is substantially perpendicular to the mounting piece.

15. The mounting apparatus of claim 9, wherein the elastic latching portion extends from each of two opposite edges of the mounting portion, and the mounting post is located between the elastic latching portions of the two opposite edges.

16. The mounting apparatus of claim 9, wherein the elastic latching portion defines a latching slot, and the side plate is engaged in the latching slot.

* * * * *